United States Patent [19]

Burke

[11] Patent Number: 5,420,071

[45] Date of Patent: May 30, 1995

[54] METHODS OF FORMING LOCAL INTERCONNECTIONS IN SEMICONDUCTOR DEVICES

[76] Inventor: Edmund Burke, 8555 Fair Oaks Crossing, Apt. 402, Dallas, Tex. 75243

[21] Appl. No.: 85,428

[22] Filed: Jun. 30, 1993

[51] Int. Cl.⁶ .................. H01l 21/28; H01l 21/3205
[52] U.S. Cl. ................................. 437/192; 437/228
[58] Field of Search ............... 437/228, 190, 192; 156/643, 667, 656

[56] References Cited

U.S. PATENT DOCUMENTS

| | | | |
|---|---|---|---|
| 4,675,073 | 6/1987 | Douglas | 156/643 |
| 4,713,141 | 12/1987 | Tsang | 156/643 |
| 4,793,896 | 12/1988 | Douglas | 156/643 |
| 4,863,559 | 9/1989 | Douglas | 156/643 |
| 4,878,994 | 11/1989 | Jucha et al. | 156/643 |
| 4,957,590 | 9/1990 | Douglas | 156/643 |
| 4,980,020 | 12/1990 | Douglas | 156/643 |
| 5,122,225 | 6/1992 | Douglas | 156/643 |

*Primary Examiner*—T. N. Quach
*Attorney, Agent, or Firm*—Alan K. Stewart; Richard L. Donaldson; William E. Hiller

[57] ABSTRACT

A method is provided for forming a local interconnect (24) at a face of semiconductor workpiece (10). A layer of conductive material (24) is formed across the workpiece face, followed by the formation of a layer (28) of photoresist adjacent the layer of conductive material (24). The layer of photoresist (28) is patterned to define selected areas of the layer of conductive material (24) to be removed. A dry etch is performed, using a plasma established in a gaseous mixture of carbon tetrachloride, carbon tetrafluoride, and helium, to remove the selected areas of the conductive material and conductive filaments (26) formed at the face of workpiece (10).

13 Claims, 2 Drawing Sheets

METHODS OF FORMING LOCAL INTERCONNECTIONS IN SEMICONDUCTOR DEVICES (C) Copyright, *M* Texas Instruments Incorporated, 1993. A portion of the Disclosure of this patent document contains material which is subject to copyright protection. The copyright and mask work owner has no objection to facsimile reproduction by anyone of the patent document or the patent disclosure, as it appears in the U.S. Patent and Trademark Office, patent file or records, but otherwise reserves all rights in its copyright and mask work whatsoever.

TECHNICAL FIELD OF THE INVENTION

The present invention relates in general to semiconductor device fabrication methods and in particular to methods for forming local interconnections.

BACKGROUND OF THE INVENTION

Titanium nitride (TIN) straps are often used in semiconductor devices to provide local interconnections between conductive regions, such as between a polysilicon line and a nearby doped region formed in the semiconductor surface. During the local interconnection formation process conductive filaments or stringers frequently develop along the sidewall oxide regions usually found adjacent the polysilicon lines. Depending on the size and location of these filaments, unwanted shorts between conductors in the semiconductor device may occur which adversely affects device performance.

The current approach to eliminating the problems associated with filaments is to remove any filaments exposed during the dry etching of the TiN, which defines the desired local interconnections, with an additional wet etch, typically using a 10:1:1 solution of $H_2O:NH_4OH:H_2O_2$. (It is generally believed that the conventional dry etches using carbon tetrachloride and helium do not remove filaments due to sidewall passivation). These wet etches however adversely affect yield. The photoresist exposed to the dry etch process has a tendency to lift during the wet etch. The wet etch then undercuts the photoresist damaging the newly defined TiN local interconnections. Depending on how early in the wet etch the lifting occurs, the damage to the TiN interconnections may range from mild degradation to complete removal of areas of the TiN material.

SUMMARY OF THE INVENTION

According to the invention, a method of forming a local interconnect at the face of a semiconductor workpiece is provided which includes forming a layer of conductive material across the workpiece face. A layer of photoresist is next formed adjacent the layer of conductive material and patterned to define selected areas of the conductive material to be removed. A dry etch is performed using a plasma established in a gaseous mixture of carbon tetrachloride, carbon tetrafluoride, and helium to remove the selected areas of the layer of conductive material and conductive filaments formed at the face of the workpiece.

Fabrication methods employing the principles of the present invention have substantial advantages over prior art methods. In particular, using a dry etch to define the local interconnection and remove filaments which may otherwise create shorts in the semiconductor device substantially eliminates the disadvantages of the conventional wet etch approach to removing filaments. Specifically, dry etch removal of filaments according to embodiments of the present invention substantially reduces or eliminates resist lifting which occurs during wet etches. By reducing or eliminating photoresist lifting, wet etch undercutting which has in the past damaged newly formed local interconnects is substantially reduced or eliminated. In sum, fabrication methods employing the principles of the present invention help reduce yield losses during the fabrication of semiconductor devices using local interconnections.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 2A:
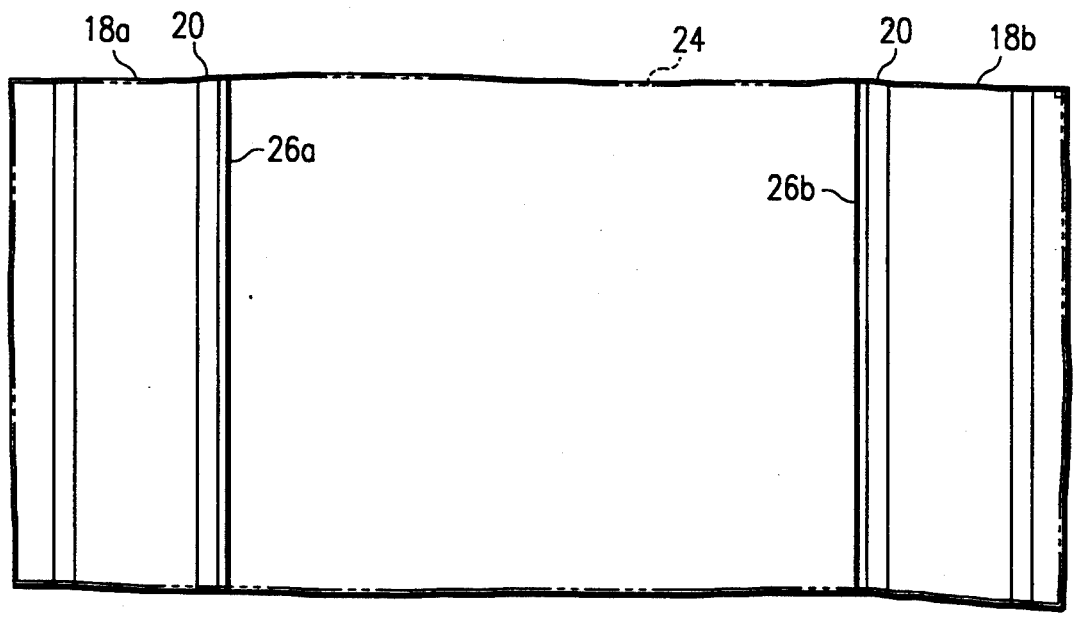
FIGS. 2a–2b are top plan views of the small portion of the semiconductor device corresponding to the cross-sectional views of FIGS. 1c and 1d respectively.
Figure 2B:
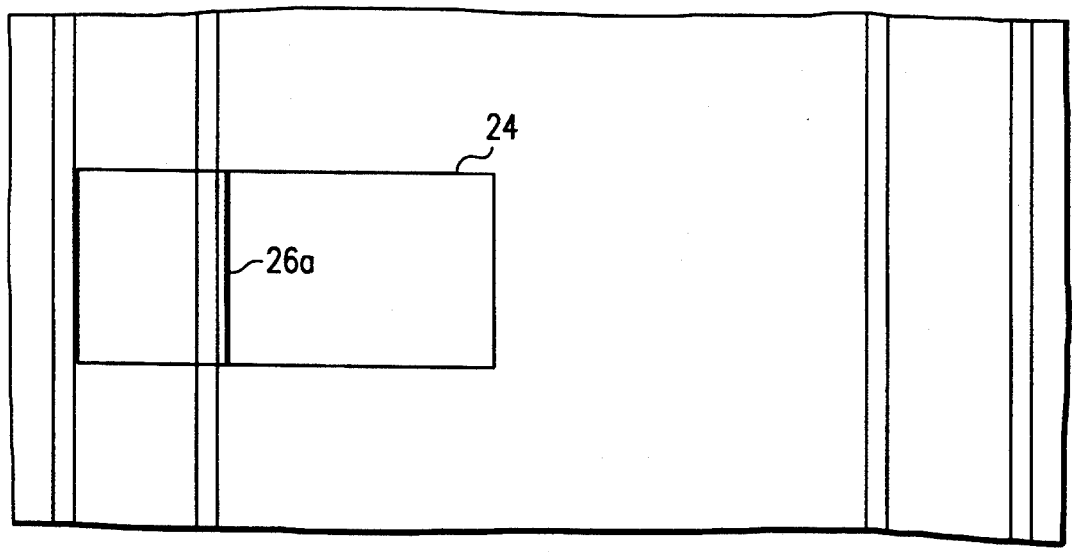
Figure 3:
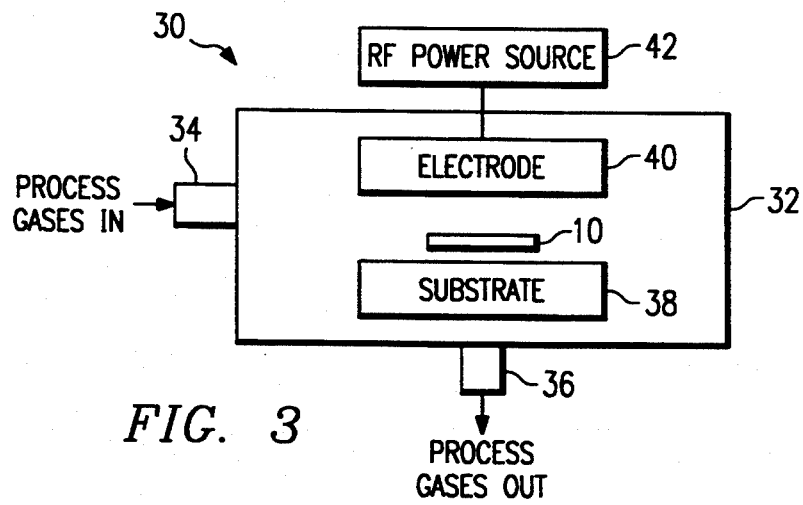
FIG. 3 generally depicts a dry (plasma) etch chamber such as may be used during at least some of the fabrication steps illustrated in FIGS. 1a–1d.

The preferred embodiment of the present invention and its advantages are best understood by referring to FIGS. 1–3 of the drawings, like numerals being used for like and corresponding parts of the various drawings.

Figure 1A:
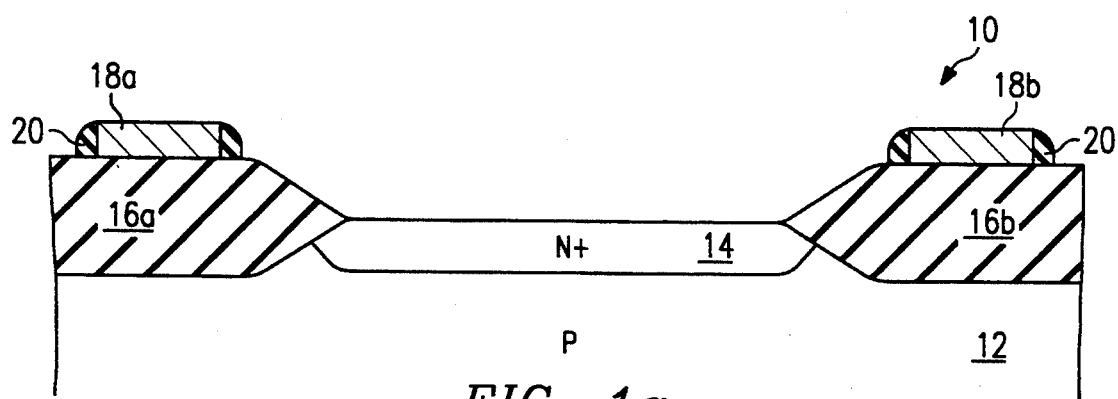
FIGS. 1a–1d, which are a series of cross-sectional views of a small portion of a semiconductor device, depict a sequence of fabrication steps illustrating the formation of a local interconnection according to the principles of the present invention.

FIGS. 1a–1d are a series of magnified cross-sectional drawings sequentially showing the formation of a typical local interconnection at the face of a semiconductor workpiece or wafer 10. FIG. 1a depicts a partially complete semiconductor device including a P-type substrate 12 in which an N-type doped region or "moat" 14 has been formed. Doped region 14 has been fabricated between a pair of thick field oxide regions 16a and 16b. Formed adjacent thick field oxide regions 16a and 16b are polysilicon conductors (lines) 18a and 18b respectively. Sidewall oxide regions 20 have been formed along the sidewalls or edges of polysilicon conductors 18a and 18b. It should be noted, that the structures shown in FIGS. 1a–1d are provided for the purpose of illustrating the principles of the present invention and that these principles can be applied to the fabrication of a variety of different semiconductor structures and devices whenever local interconnections are required.

Figure 1B:
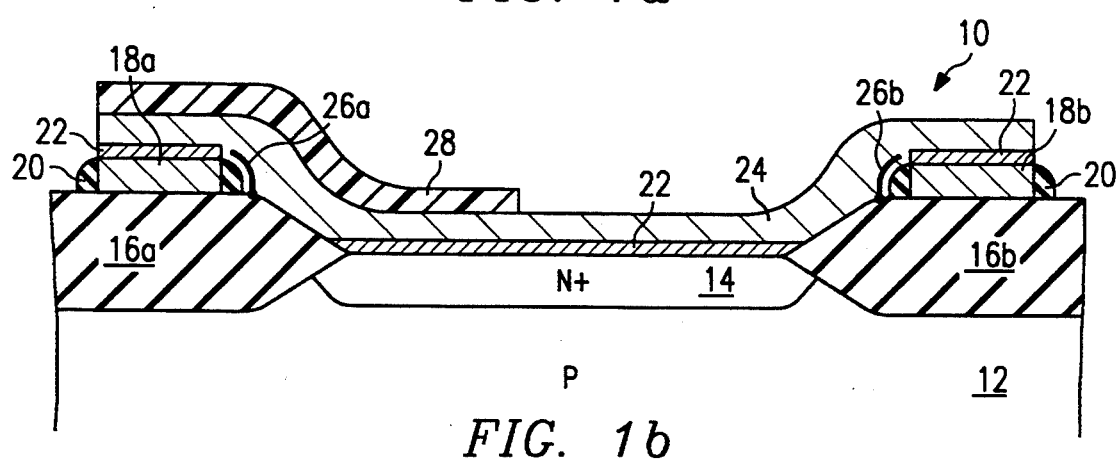

Referring next to FIG. 1b, a layer of titanium (Ti) is sputtered across the face of workpiece 10 and reacted at a high temperature (approximately 675° C.) in a nitrogen atmosphere for approximately thirty minutes. During this process, layers 22 of titanium silicide are formed across the exposed surfaces of polysilicon conductor layers 18a and 18b and the surface of moat 14. At the same time, titanium nitride (TIN) layer 24 is formed across the face of workpiece 10 where titanium has been sputtered. In this example, approximately four hundred (400) Angstroms of TiN is formed over titanium silicide layers 22, which are approximately fifteen-hundred (1500) Angstroms thick. Approximately one-thousand (1000) Angstroms of TiN are formed adjacent sidewall oxides 22 and exposed areas of field oxide regions 16. During the formation of the silicide layers 22, filaments such as filaments 26a and 26b shown in FIG. 1b are formed along sidewall oxides 20. Filaments 26 are generally believed to be composed of Ti/Si/O due to the favorable disassociation of silicon dioxide (SiO$_2$) by Ti at the sinter temperature. Next, a layer 28 of photoresist, for example a 9700 Angstrom thick layer of Aspect 810 photoresist, is formed across the face of workpiece 10 and patterned to define boundaries of the desired local interconnects, such as the example interconnect being formed in FIGS. 1a-1d. Next, a light ash clean-up (e.g. exposures for 100 standard cubic centimeters per minute (sccm) He, 40 sccm O$_2$) is performed followed by a hardbake (e.g. exposure for one hour at a temperature of 120° C.). A second light ash clean-up may next be performed to ensure that no solvents in the photoresist will interfere with the upcoming dry etch.

FIG. 2a is a top plan view of the portion of workpiece 10 corresponding to the cross-sectional views of FIGS. 1b, looking through TiN layer 24 which covers workpiece 10. From FIG. 2a, it can be seen that filaments 26a and 26b may run along a substantial length of the sidewall of the polysilicon conductors 18. A shorting problem may occur if a filament such as filament 26a or 26b intersects another conductor (not shown) at the face of semiconductor workpiece 10, such as an intersecting layer of polysilicon conductor or another TiN local interconnect, for example.

Figure 1C:
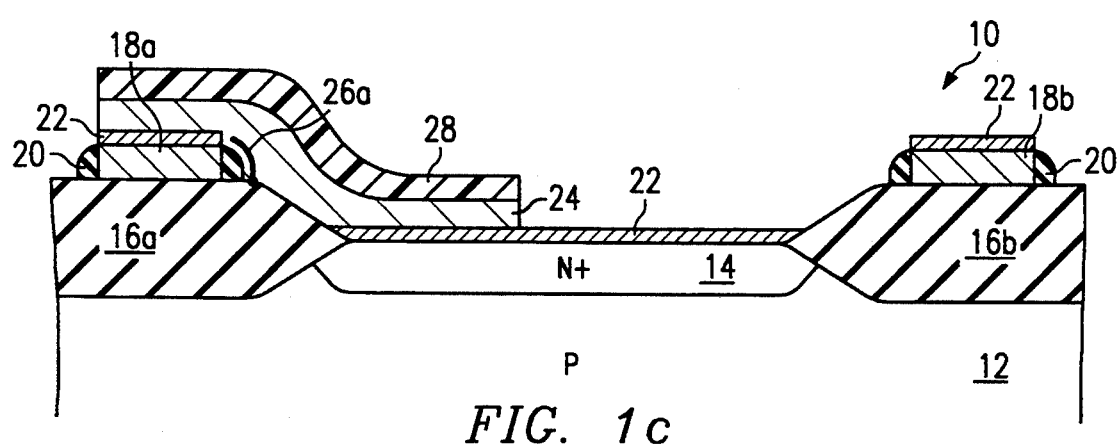

Next, a dry (plasma) etch is performed according to the invention to remove the unnecessary portions of TiN layer 24, and at the same time filaments 26 are left unprotected by photoresist 28 as is illustrated in FIG. 1c. The remaining portion of TiN layer 24 constitutes the desired local interconnection between polysilicon line 18a and moat 14.

The dry etch may be performed in a plasma etching system similar to system 30 shown in FIG. 3. Plasma etching system 30 generally includes chamber 32 having port 34 for introducing process gases and output port 36 for removing process gases from chamber 32. System 30 also includes substrate 38 for supporting workpiece 10 and electrode 40 for introducing radio frequency signals into chamber 32 to establish an etching plasma in the gases introduced. Electrode 40 may be for example a graphite electrode and the substrate may be either grounded or biased, as known in the art.

According to the principles of the present invention, a dry (plasma) etch using a 6:2:1 mixture of carbon tetrachloride (CCl$_4$), helium and carbon tetrafluoride (CF$_4$) is performed which will etch both the TiN layer 24 and the unprotected filaments 26. In one embodiment of the present invention, the temperature of substrate 38 and electrode 40 is maintained in the range of 60°-80° C., the RF power input maintained at approximately 220 Watts and the chamber ambient pressure maintained at approximately 380 mtorr. In a preferred embodiment, 90 SCCM of carbon tetrachloride, 30 SCCM of helium and 15 SCCM of carbon tetrafluoride are introduced into the plasma etching chamber. Additionally, in the preferred embodiment an over-etch of 20 seconds is performed.

According to the present invention, the need for wet etch removal becomes completely unnecessary since the virtual filaments 26b are left unprotected by removal of photoresist 28 during the dry etch step. Consequently, the problems found in the conventional wet etch removal of unwanted filaments are eliminated. In particular, this dry etch does not lift photoresist layer 28 thereby substantially reducing or eliminating the problem of wet etch undercut. This provides the substantial advantage of reducing yield loss due to damaged local interconnections such as those formed from TiN layer 24.

Figure 1D:
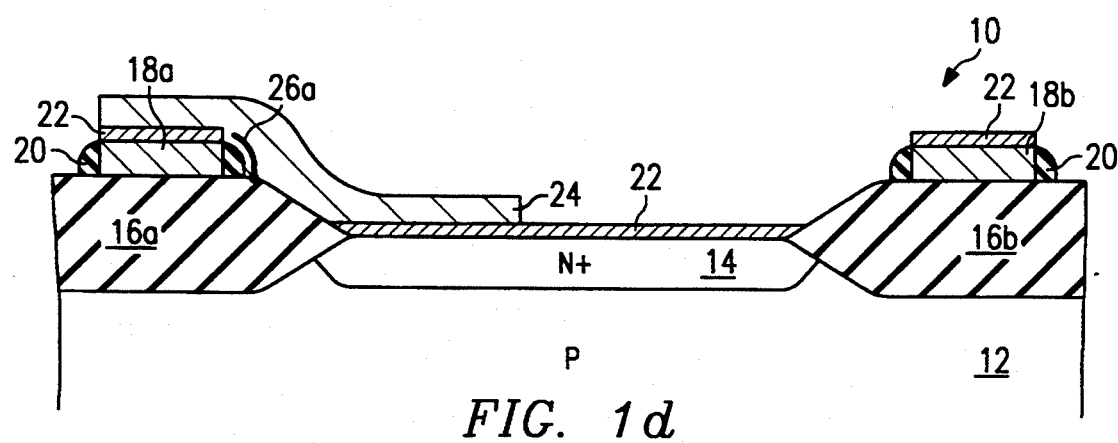

FIG. 1d shows an example of a completed local interconnect 24. The patterned layer of photoresist 28 has been removed using a conventional process. It should be noted, that the areas of filament 26a underlying local interconnect 24 remain while exposed areas of filaments 26a and 26b have been removed, as illustrated in FIG. 2b. The unremoved portions of the filaments which lie under the remaining portions of TiN layer 24, such as demonstrated in FIGS. 1d and 2b, do not represent a shorting problem since they do not extend beyond the boundaries of the local interconnections 24 to short with other conductors.

Although the present invention and its advantages have been described in detail, it should be understood that various changes, substitutions and alterations can be made herein without departing from the spirit and scope of the invention as defined by the appended claims.

What is claimed is:

1. A method of forming a local interconnect at a face of a semiconductor workpiece comprising the steps of:
   forming a layer of conductive material across the workpiece face;
   forming a layer of photoresist over the layer of conductive material;
   patterning the layer of photoresist to define selected areas of the layer of conductive material to be removed; and
   performing a dry etch in a plasma etch chamber using a plasma established from a gaseous mixture of carbon tetrachloride, helium, and carbon tetrafluoride in a ratio of 6:2:1 to remove the layer of conductive material from the selected areas.

2. The method of claim 1, wherein said steps of performing an etch comprises the substeps:
   introducing carbon tetrachloride into the chamber at a rate of approximately 90 standard cubic centimeters per minute;
   introducing helium into the chamber at a rate of approximately 30 standard cubic centimeters per minute; and
   introducing carbon tetrafluoride into the chamber at a rate of approximately 15 standard cubic centimeters per minute.

3. The method of claim 1, wherein said step of forming a layer of conductive material comprises the step of forming a layer of titanium nitride.

4. The method of claim 1, wherein said step of forming a layer of conductive material comprises the substeps of:
   forming a layer of titanium across the face of the workpiece; and
   exposing the workpiece to heat in a nitrogen atmosphere to form layers of silicide across surfaces of areas of silicon at the face of the workpiece and a layer of titanium nitride across a substantial portion of the entire face of the workpiece.

5. A method of forming a local interconnect at a face of a semiconductor workpiece comprising the steps of:
   forming a layer of titanium nitride across the workpiece face;

forming a layer of photoresist over the layer of titanium nitride;

patterning the layer of photoresist to define selected areas of the layer of titanium nitride to be removed; and performing a dry etch to remove the selected areas of the layer of titanium nitride, the dry etch includes a mixture of carbon tetrachloride, helium, and carbon tetrafluoride in a ratio of 6:2:1.

6. The method of claim 5, wherein said step of performing a dry etch comprises the substeps:

placing the workpiece inside a plasma etch chamber;

introducing a mixture of carbon tetrachloride, helium, and carbon tetrafluoride gases into the chamber; and introducing a radio frequency signal into the chamber to maintain an etching plasma in the mixture of gases.

7. The method of claim 5, wherein said step of performing a dry etch comprises the substeps of:

disposing the workpiece inside a plasma etch chamber;

introducing carbon tetrachloride gas into the chamber at a rate of approximately 90 standard cubic centimeters per minute;

introducing helium gas into the chamber at a rate of approximately 30 standard cubic centimeters per minute;

introducing carbon tetrafluoride gas into the chamber at a rate of approximately 15 standard cubic centimeters per minute; and introducing a radio frequency signal into the chamber to establish a plasma for etching away the selected areas of the layer of titanium nitride.

8. The method of claim 5, wherein said step of introducing a radio frequency signal comprises the step of introducing a radio frequency of a power of approximately 220 Watts.

9. A method of forming an interconnection between first and second conductors disposed at the face of a semiconductor workpiece, the semiconductor workpiece further including sidewall oxide regions formed at selected locations thereon, the method comprising the steps of:

forming a layer of titanium across surfaces of the first and second conductors and the sidewall oxide regions;

exposing the workpiece to heat in a nitrogen atmosphere to silicide the surfaces of the first and second conductors and form a layer of titanium nitride across the silicided surfaces of the first and second conductors and the sidewall oxide regions, filaments being created adjacent the sidewall oxide regions during said step of exposing;

forming a layer of photoresist over the layer of titanium nitride;

patterning the layer of photoresist to define selected areas of said layer of titanium nitride to be removed; and performing a dry etch to remove the selected areas of the layer of titanium nitride to define a titanium nitride interconnection between the first and second conductors and to remove the filaments, using a plasma etch chamber into which is introduced carbon tetrachloride, helium, and carbon tetrafluoride in a ratio of 6:2:1.

10. The method of claim 9, wherein said step of performing a dry etch comprises the step of performing a dry etch using a gaseous mixture of carbon tetrachloride, carbon tetrafluoride and helium.

11. The method of claim 9, wherein said step of performing a dry etch comprises the substeps of:

introducing carbon tetrachloride gas into the chamber at a rate of approximately 90 standard cubic centimeters per minute;

introducing helium gas into the chamber at a rate of approximately 30 standard cubic centimeters per minute; and introducing carbon tetrafluoride gas into the chamber at a rate of approximately 15 standard cubic centimeters per minute.

12. The method of claim 9, wherein the chamber ambient pressure is maintained at approximately 380 mtorr.

13. The method of claim 9, wherein the temperature of the chamber electrode and substrate is maintained in a temperature range of 60° to 80° C.

* * * * *